United States Patent [19]
McCarroll et al.

[11] Patent Number: 5,521,599
[45] Date of Patent: May 28, 1996

[54] HIGH SPEED ANALOG SIGNAL SAMPLING SYSTEM

[75] Inventors: Benjamin J. McCarroll, Portland; Steven K. Sullivan, Beaverton, both of Oreg.

[73] Assignee: Tektronix, Inc., Wilsonville, Oreg.

[21] Appl. No.: 323,178

[22] Filed: Oct. 14, 1994

[51] Int. Cl.⁶ .................................................... H03M 1/12
[52] U.S. Cl. ................................................... 341/122
[58] Field of Search .................................. 341/122, 155, 341/123, 124, 125

[56] References Cited

U.S. PATENT DOCUMENTS 4,766,602  8/1988  Wilkinson et al. ................. 375/116
5,199,046  3/1993  Ling ...................................... 375/8

Primary Examiner—Brian K. Young
Attorney, Agent, or Firm—William A. Birdwell

[57] ABSTRACT

A high speed analog signal sampling system. The system comprises a timing chain having a plurality of delay elements arranged in series and a sample rate multiplier having a delay lock control system responsive to the outputs of first, second and third parallel delay elements in the sample rate multiplier to control the delay of the second parallel delay element so that its strobe signal output occurs one-half the time between the strobe signal outputs of the first parallel delay element and the third parallel delay element. The first, second and third parallel delay elements are the first three parallel delay elements of the timing chain, and a control signal of the delay lock control system is used to adjust and control the amount of delay introduced by every other parallel delay element after the second parallel delay element. The second and third parallel delay elements straddle one of the series delay elements in the timing chain, while the first parallel delay element has the same input as the second parallel delay element. The delay lock control system employs a sampling circuit which samples the strobe signal output of the first parallel delay element in response to an output of the second parallel delay element and which samples the strobe signal output of the second parallel delay element in response to an output of the third delay element, and further employs a control circuit which filters the difference between those two sampled output signals and provides that filtered difference as the control signal.

12 Claims, 4 Drawing Sheets

HIGH SPEED ANALOG SIGNAL SAMPLING SYSTEM

BACKGROUND OF THE INVENTION

This invention relates to high speed analog signal acquisition. More particularly, this invention relates to circuits and methods for increasing the number of samples of an analog signal acquired in response to respective primary strobe clock signals by inserting between those primary clock strobe signals secondary strobe signals having a controlled phase delay with respect to the primary strobe signals.

In known Fast In, Slow Out ("FISO") digitizers, the highest sampling rate of an incoming analog signal is determined by a delay line comprising a series of buffers, where each buffer introduces a delay and wherein the total delay of all the buffers is forced by a control system to equal the period of a reference clock. The series of buffers is referred to as a "timing chain." The output of each buffer provides a strobe signal used to acquire a sample of an analog signal at a unique point in time.

The average delay of the buffers can reliably be tuned to a minimum of about 500 picoseconds using a 1 micron CMOS fabrication process, which, for a series of 33 buffers, results in a maximum of about 2 Gigasamples per second ("GS/s"). However, to achieve the same sample rate at substantially more than 33 samples, or to achieve higher sample rates with the same number of samples, the timing chain approach has been found to be inadequate.

For example, it is known that the sampling rate of a timing chain can be doubled by connecting two buffers in parallel to the output of each buffer in the series, the two parallel buffers having different signal delays and providing the strobe signals. However, an increase of the overall sampling rate above 2 GS/s is still not made practical by this approach because of limitations on the accuracy and stability of the delays introduced by the individual buffers in the chain.

In addition, although the sum of buffer delays is kept correct, individual delays are usually inconsistent, resulting in non-uniformly sampled data. When sampling high-speed analog inputs with bandwidths as high as 1 Ghz, timing errors on the order of a few picoseconds become significant in an 8-bit representation of the acquired signal.

There are two techniques known to be applied to this problem. One is to use microprocessor software to correct the sampled data, wherein a digital signal processing ("DSP") algorithm is applied to make the non-uniformly sampled data nearly uniform in time. Another is to correct the individual delays of the timing chain using hardware. Both techniques require that (1) the individual delays, though not equal to one another, be at least substantially constant in time, and (2) the individual delays, though constant in time, do not vary so much from one another that adjacent samples overlap. If the delays do change significantly, a lengthy calibration process must be invoked whether software or hardware correction is used.

Accordingly, there is a need for a novel method and circuit architecture for high speed sampling of analog signals to obtain uniformly spaced samples at rates in excess of 2 GS/s without the need for frequent, lengthy calibration of the signal sampling system.

SUMMARY OF THE INVENTION

The high speed analog signal sampling system of the present invention solves the aforementioned problems and meets the aforementioned need by employing a sample rate multiplier which includes a delay lock control system to maintain the delays of the individual sample signals within an acceptable degree of accuracy. A system for sampling an analog signal according to the present invention comprises a timing chain having a plurality of delay elements, such as buffers, arranged in series and a sample rate multiplier having a delay lock control system responsive to the outputs of first, second and third parallel delay elements in the sample rate multiplier to control the delay of the second parallel delay element so that its sample signal output occurs one-half the time between the sample signal outputs of the first parallel delay element and the third parallel delay element. Preferably the sample rate multiplier is a sample rate doubler, the first, second and third parallel delay elements are the first three parallel delay elements of the timing chain, and a control signal of the delay lock control system is used to adjust and control the amount of delay introduced by every other parallel delay element after the second parallel delay element. The second and third parallel delay elements straddle one of the series delay elements in the timing chain, while the first parallel delay element has the same input as the second parallel delay element. The delay lock control system employs a sampling circuit which samples the strobe signal output of the first parallel delay element in response to an output of the second parallel delay element and which samples the strobe signal output of the second parallel delay element in response to an output of the third delay element, and further employs a control circuit which filters the difference between those two sampled output signals and provides that filtered difference as the control signal.

Therefore, it is a principal object of the present invention to provide a novel and improved high speed analog signal sampling system and method.

It is another object of the present invention to provide an analog signal sampling system and method which provides satisfactorily uniformly spaced samples at rates greater than two Gigasamples per second.

It is a further object of the present invention to provide an analog signal sampling system and method which minimizes the effects of limitations on the accuracy and stability of delays introduced by individual delay elements, so as to achieve high sample rates.

It is yet another object of the present invention to provide a high speed analog signal sampling system and method which does not require frequent or lengthy calibration.

The foregoing and other objects, features and advantages of the invention will be more readily understood upon consideration of the following detailed description of the invention, taken in conjunction with the accompanying drawings.

DETAILED DESCRIPTION OF A PREFERRED EMBODIMENT

Figure 1:
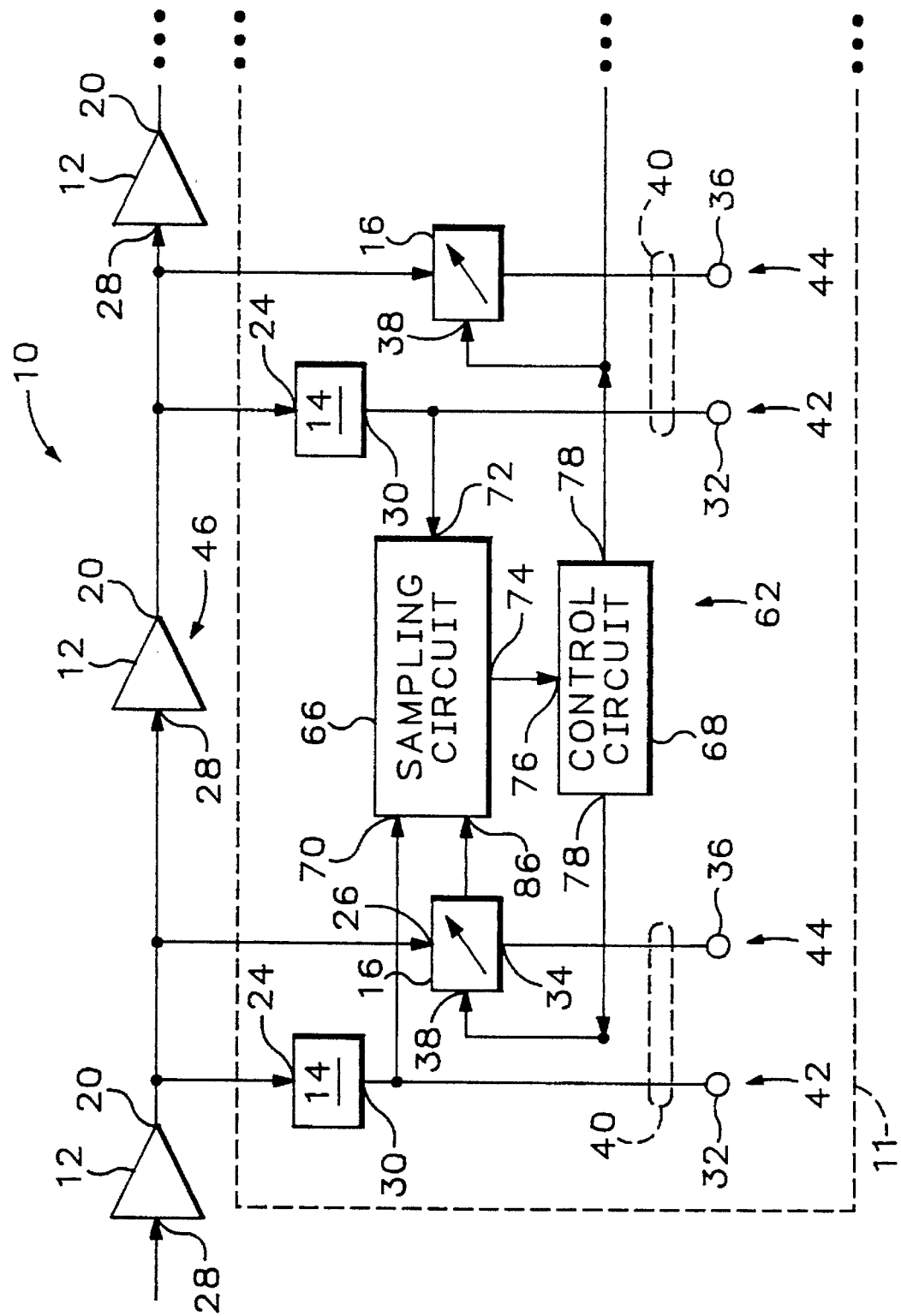
FIG. 1 is a block diagram of a preferred embodiment of a high speed analog signal sampling system according to the present invention.

Referring to FIG. 1, a preferred embodiment of a high speed analog signal sampling system 10 according to the present invention includes a plurality of fixed delay elements 12, such as buffers, connected in series, and a sample rate multiplier 11, which includes a plurality of delay elements 14 and 16 connected at their respective inputs 24 and 26 to respective outputs 20 of the series of delay elements 12. The fixed delay elements 12 are referred to collectively hereafter as a "timing chain," only a portion of which is shown in FIG. 1. As is well known in the art, the timing chain includes a closed loop control system (not shown) so as to control the cumulative delay produced by the timing chain. There may be any number of delay elements 12 in the timing chain, however it has been found that 33 delay elements 12 is optimal for use in high speed digital oscilloscopes. The system further comprises strobe outputs 32 and 36, at which sample signals having unique phase delays are provided to strobe an analog signal and provide its digital values to respective storage circuitry (not shown), such as the capture cells described in Saxe, U.S. Pat. No. 5,144,525, herein incorporated by reference in its entirety.

Each of the fixed delay elements 12 has an output 20 connected to a fixed parallel delay element 14 and an adjustable parallel delay element 16 through an input 24 and an input 26 respectively. A reference clock signal is applied to an input 28 of a first of the delay elements 12 and propagates down the chain. Each input 28 of each fixed delay element 12 "sees" the clock signal having a different delay due to the delays created by the preceding fixed delay elements. Preferably the delays created by each of the fixed delay elements 12 are substantially equal at all operating conditions. To the extent that they are not substantially equal but their variations move substantially in the same way and to the same degree with changing operating conditions, calibration schemes may be employed to correct for the differences. If the delays of each of the fixed delay elements 12 are not substantially equal and their variations do not move substantially the same way and to the same degree with changing operating conditions, calibration schemes may still be employed, but are lengthy and complex and therefore are less desirable.

Each of the fixed parallel delay elements 14 provides the clock signal through an output 30 to a first branch strobe output 32 for sampling the analog signal. The clock signal appearing at the first branch strobe output 32 corresponds to the clock signal present at the output of the associated fixed delay element 12, but is not temporally equal to the clock signal thereat due to the additional delay added by the delay element 14. Each of the adjustable parallel delay elements 16 provides the clock signal through an output 34 to a second branch strobe output 36 for sampling the analog signal. The adjustable parallel delay elements 16 include a respective delay adjustment input 38 for adjusting their delays. The clock signal appears at the second branch output 36 and represents an additional sample over the number of samples available directly from the timing chain, the additional sample having an adjustable delay responsive to the signal presented at the delay adjustment input 38.

The parallel delay elements 14 and 16 comprise parallel branches 40. The fixed parallel delay element 14 comprises a first branch 42, and the adjustable parallel delay element 16 comprises a second branch 44. Further, with respect to a selected fixed delay element 12 of the timing chain, for example the fixed delay element 12 identified by numeral 46, the first branch 42 and the second branch 44 preceding the fixed delay element 46 are preceding branches, and the first branch 42 and the second branch 44 following the fixed delay element 46 are following branches. Preferably, each of the fixed delay elements 12 after the first such delay element in the timing chain has associated with it a first and second preceding branch and a first and second following branch; however, fewer fixed delay elements 12 may have associated first and second branches without departing from the principles of the invention.

The first of the adjustable parallel delay elements 16 is preferably selected to cooperate with a delay lock control system 62 for adjustment of the delay of the adjustable parallel delay elements 16. Though it is preferable to select the first and only one of the adjustable parallel delay elements 16 to cooperate with one control system 62, any and any number of adjustable parallel delay elements 16 may cooperate with an associated control system without departing from the principles of the invention.

The delay lock control system 62 comprises a sampling circuit 66 and a control circuit 68, for adjusting and controlling the delay of the adjustable parallel delay elements 16. The sampling circuit 66 includes a first preceding branch delay input 70, responsive to the output 30 of the fixed parallel delay element 14 of the first preceding branch, a first following branch delay input 72, responsive to the output 30 of the fixed parallel delay element 14 of the first following branch, and a second preceding branch delay input 86, responsive to the output 34 of the adjustable parallel delay element 16 of the second preceding branch. The sampling circuit 66 compares the phase of the signals at each of the inputs 70, 72 and 86, to create an error signal output at 74 which is representative of the amount by which the delay of the clock signal at the second branch output 36 differs from the numerical average of the delay of the clock signal at the first preceding branch output 32 and the first following branch output 32. However, the error signal may represent any desired functional relationship between the first and second branch outputs 32 without departing from the principles of the invention.

The control circuit 68 includes input 76, which receives the output of the sampling circuit 66 appearing at 74, and includes an output 78, connected to the inputs 38 of all of the adjustable parallel delay elements 16 to control their respective delays. The control circuit 68 provides a control signal through the output 78 which represents the accumulation of the error signal transmitted by the sampling circuit 66. The transfer function of the control circuit 68 is preferably such that the delay lock control system 62 is robust, stable over process and temperature, and has zero steady state delay error. Accordingly, the control circuit 68 preferably has a transfer function of the form $K/(1-1/z)$; however other transfer functions, analog or digital, may be used without departing from the principles of the invention.

Figure 2:
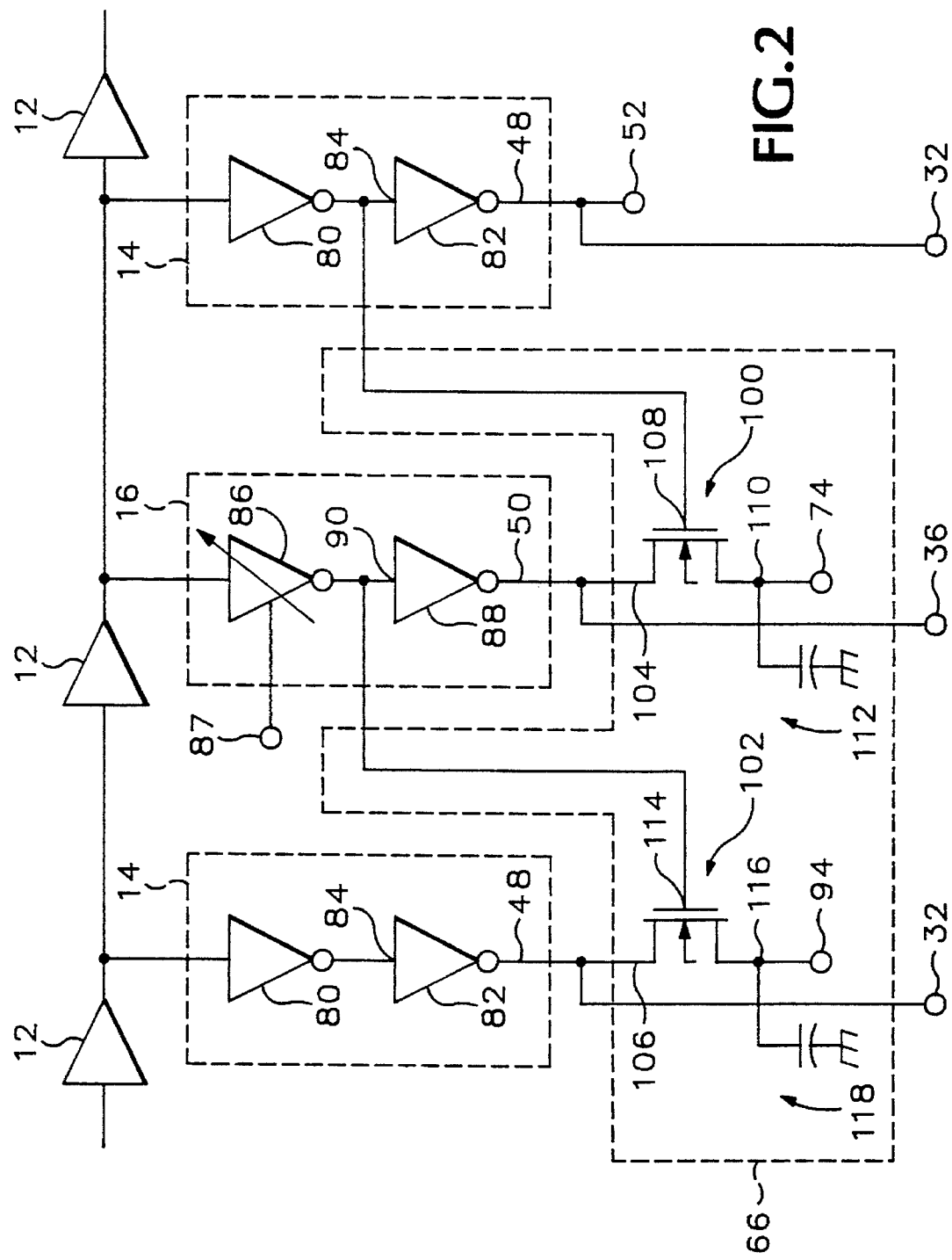
FIG. 2 is a schematic diagram of a portion of an analog signal sampling system of the type shown in FIG. 1, showing sampling and control circuits portions of a control portion of the system.

Referring to FIG. 2, a detail of the sampling circuit 66 is shown with the delay elements 12, 14 and 16, where, in a preferred embodiment, the delay elements 14 and 16 comprise inverters fabricated in CMOS. The fixed parallel delay element 14 comprises an inverter 80 and an inverter 82 having an input 84 and a first sample signal output 48. The input 84 of the inverter 82 is connected to the output of the inverter 80. The adjustable parallel delay element 16 comprises an adjustable delay inverter 86, having an adjustable delay input 87, and a fixed delay inverter 88, having an input 90 and a second sample signal output 50. The input 90 of the inverter 88 is connected to the output of the adjustable inverter 86. The first sample signal output 48 represents a clock signal having a first delay; the second sample output 50 represents a clock signal having a second delay; and an output 52 of the first following branch represents a clock signal having a third delay.

The sampling circuit 66 further includes a first sample-hold circuit 100 and a second sample-hold circuit 102. The first sample-hold circuit 100 has a signal input 104 responsive to the sample signal output 50, and the second sample-hold circuit 102 has a second signal input 106 responsive to the sample signal output 48. The first sample-hold circuit 100 further has a gate 108, responsive to the output of the inverter 80 of the first following delay element, for switching the first sample-hold circuit on and off, and an output 110 connected to a parasitic storage capacitor 112, which temporarily stores the reference positive value of the error signal output at 74. The second sample-hold circuit 102 similarly has a gate 114, for switching the second sample-hold circuit on and off, responsive to the output of the delay element 86 of the second preceding branch, and an output 116 connected to a parasitic storage capacitor 118, which temporarily stores the reference negative value of the error signal output at 94.

The sample signal outputs 48 and 50 comprise strobe outputs 32 and 36 respectively. The inverters 80, 82, 86 and 88 preferably are fabricated in CMOS. Sample-hold circuits 102 and 100 preferably are MOSFETS.

The sampling circuit 66 operates as follows: a rising edge of the clock signal available at the output 48 of inverter 82 is sampled by the second sample-hold circuit 102 according to the value of a falling edge of the clock signal available at the input 106 of the sample-hold circuit, by control of the gate 114. The clock signal will be rising at the output 48 at the same time it is falling at the input 84, to the extent that the delay of the inverter 82 is insubstantial.

Similarly, a rising edge of the clock signal available at the sample signal output 50 of the inverter 88 is sampled by the first sample-hold circuit 100 according to the value of a falling edge of the clock signal available at the input 104 of the first sample-hold circuit, by control of the gate 108.

Figure 3:
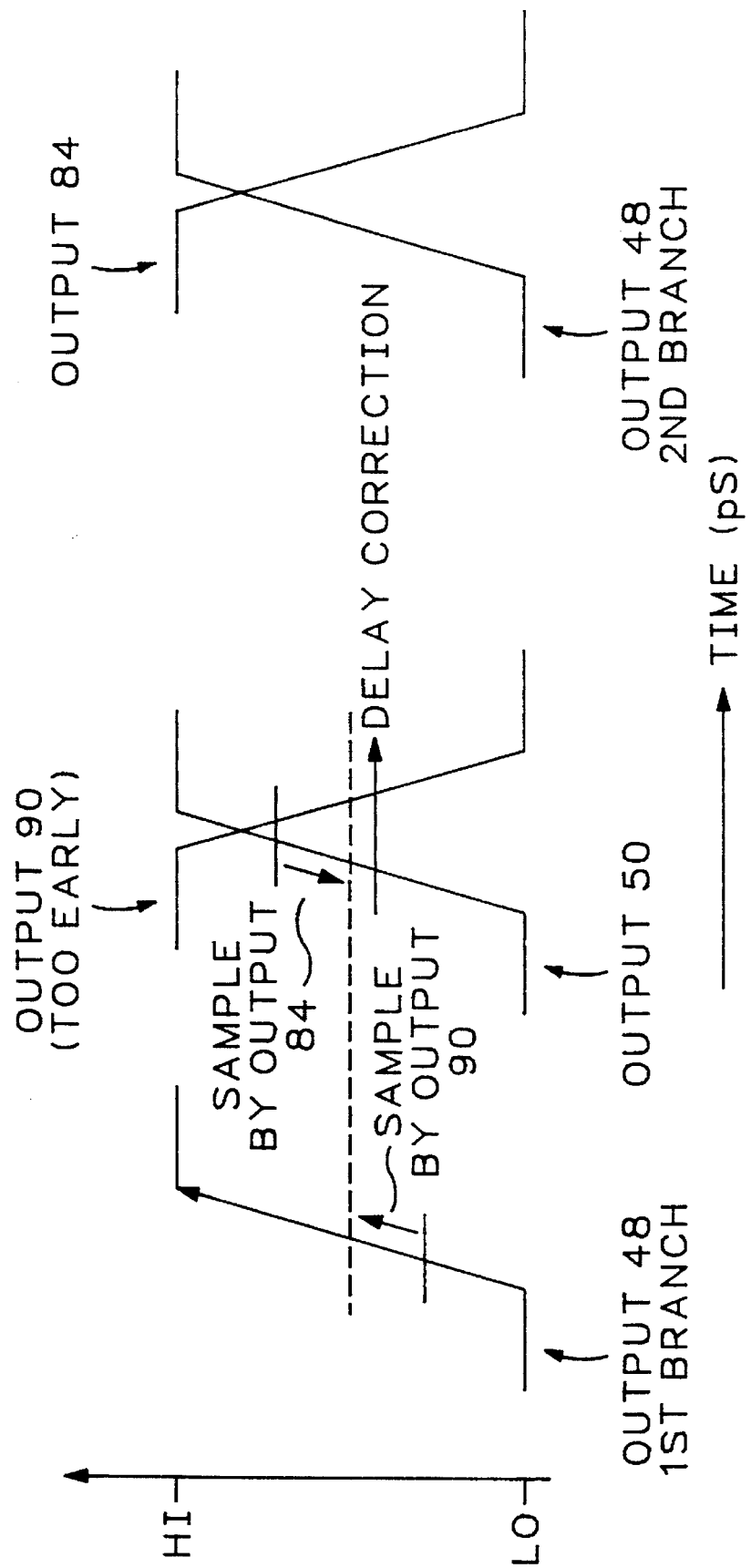
FIG. 3 is an exemplary timing diagram for the sampling and control portions of the system shown in FIG. 2.

Referring to FIG. 3, in a preferred embodiment, the second sample-hold circuit 102 ideally will sample the rising edge at the first branch output 48 mid-scale of its rise, and the first sample-hold circuit 100 will sample the rising edge at output 50 mid-scale of its rise. Consequently, the delay between the signal at 90 of the second preceding branch of the adjustable parallel delay element 16 and the signal at 84 of the first following branch of the fixed parallel delay element 14 will ideally be made to precisely equal the delay between the signals at sample signal outputs 48 and 50 respectively of the preceding branches, by adjustment of the delay of the delay element 16 through an error signal derived from the voltages on parasitic capacitances 118 and 112.

However, if the falling edge at 90 occurs too early, the second sample-hold circuit 102 will sample the rising edge at output 48 too early and consequently below mid-scale, while the first sample-hold circuit 100 will sample the rising edge at output 50 too late, and therefore above mid-scale. The too-low value of voltage at output 48 will be temporarily stored at parasitic capacitance 118 as the positive reference voltage of the error signal and the too-high voltage of the output 50 will be temporarily stored at parasitic capacitance 112 as the negative reference voltage of the error signal, consequently producing a negative error signal representative of the deviation of delay in the output at 50 from the ideal value. The error signal is proportional to the voltage at 90 minus the numeric average of the voltages at 48 and at 84. Therefore, the error signal will correct the timing of output 90 so that the first branch output 48 and output 50 will be sampled at mid-scale, in a manner described below, the correction being represented by the arrows in FIG. 3.

Similarly, if the falling edge at 90 occurs too late, the first and second sample-hold circuits will provide a positive error signal representative of the deviation from the ideal value.

Figure 4:
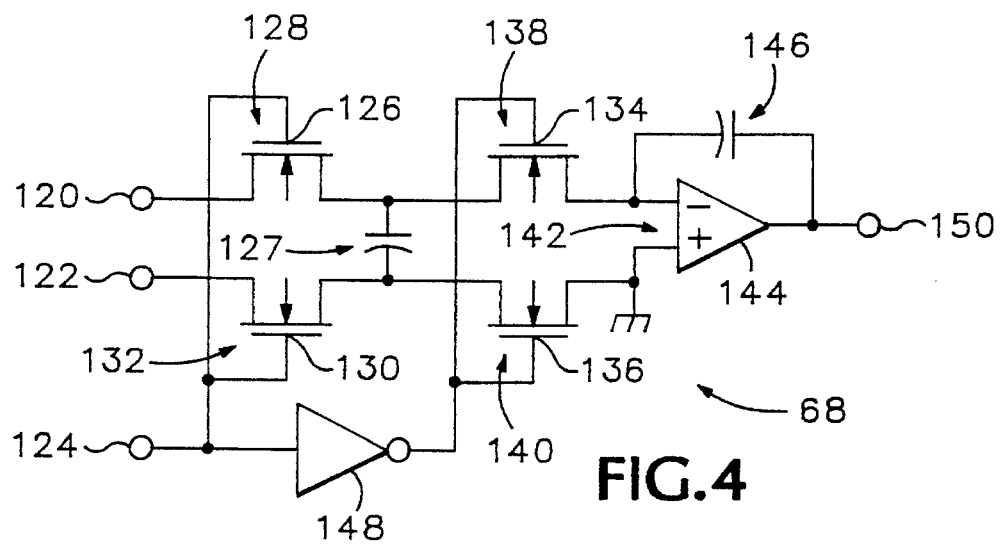
FIG. 4 is a schematic diagram of a portion of an analog signal sampling system of the type shown in FIG. 1, showing a switched capacitor discrete time accumulator circuit of a control portion of the system.

Referring to FIG. 4, the error signal available at the outputs 116 and 110 of the sampling circuit 66 (FIG. 2) is provided to the control circuit 68, which is a switched capacitor accumulator. The output 116 is connected to an input 120 of the control circuit 68, and the output 104 is connected to an input 122 of the control circuit 68, to provide an error signal to the control circuit 68.

A clock signal is applied to an input 124, where it is routed to an input 126 of a switching element 128 and an input 130 of a switching element 132. When switched "on" by the clock signal, the switching elements 128 and 132 conduct the error signal to a first storage capacitor 127. Because an inverted clock signal, via an inverter 148, is presented to the inputs 134 and 136 of the switching elements 138 and 140 respectively, those switching elements are "off" and the first storage capacitor 127 stores the value of the difference between the signals applied at the inputs 120 and 122.

When the clock toggles, the switching elements 128 and 132 are turned "off" and the switching elements 138 and 140 are turned "on" by the inverter 148. The charge stored on the first storage capacitor 127 is thereby applied to an input 142 of an operational amplifier 144 through an input 134 and 136 of the switching elements 138 and 140 respectively. The operational amplifier 144 preferably has low DC off-set, to reduce feedback error. The operational amplifier 144 drives and holds the voltage across a second storage capacitor 146 to equal the voltage input at 142.

Further toggling of the clock continues to trigger the control circuit 68 to capture periodically the error voltages at inputs 120 and 122 and transfer the difference between those voltages to the input 142 of the operational amplifier 144 which accumulates the error voltage according to its discrete time ("Z") transfer function $H(z)=C1/(C2*(1-1/z))$, where C1 is the value of the first storage capacitor 127 and C2 is the value of the second storage capacitor 146.

The transfer function of the control circuit 68 describes mathematically the output 78 of the control circuit 68 with respect to the input 76. Specifically, the transfer function is multiplied by the z transform of the input 76 to provide the z transform of the output 78. Then, the desired time domain signal at the output 78 is retrieved from its z transform by inverse transformations as is well known in the art. The transfer function given herein provides for unconditional stability and zero steady state error (for zero DC offset in the op-amp 144), as will be appreciated by a person of ordinary skill in the art. The output 150 presents the resultant control signal to the adjustable parallel delay elements 16 (FIG. 1), to adjust their delays toward the ideal described above.

The switching elements 128, 132, 138 and 140 preferably are MOSFETS. The inverter 148 and the operational amplifier 144 preferably are fabricated in CMOS.

Referring to FIGS. 5 (a) and 5 (b), two alternative preferred embodiments of the delay elements 16 are shown. FIG. 5 (a) shows a delay element 16 having an adjustable delay in fall time, while FIG. 5 (b) shows a delay element 16 having an adjustable delay in rise time. Either strobing the analog signal on a rising clock edge or strobing on a falling clock edge may be selected. One of the two embodiments may be preferred, but the principle of the invention is maintained for either embodiment used with either selection.

An inverter 152, preferably fabricated in CMOS, is controlled by an input 26 of the delay elements 16. The delay adjustment input 38 controls the conductance of an adjustment element 154 through a connection to the feedback circuit output 150 (FIG. 4). The adjustment element 154 is preferably a MOSFET having a gate 156 responsive to the error voltage available at output 150 of the control circuit 68.

Figures 5A, 5B:
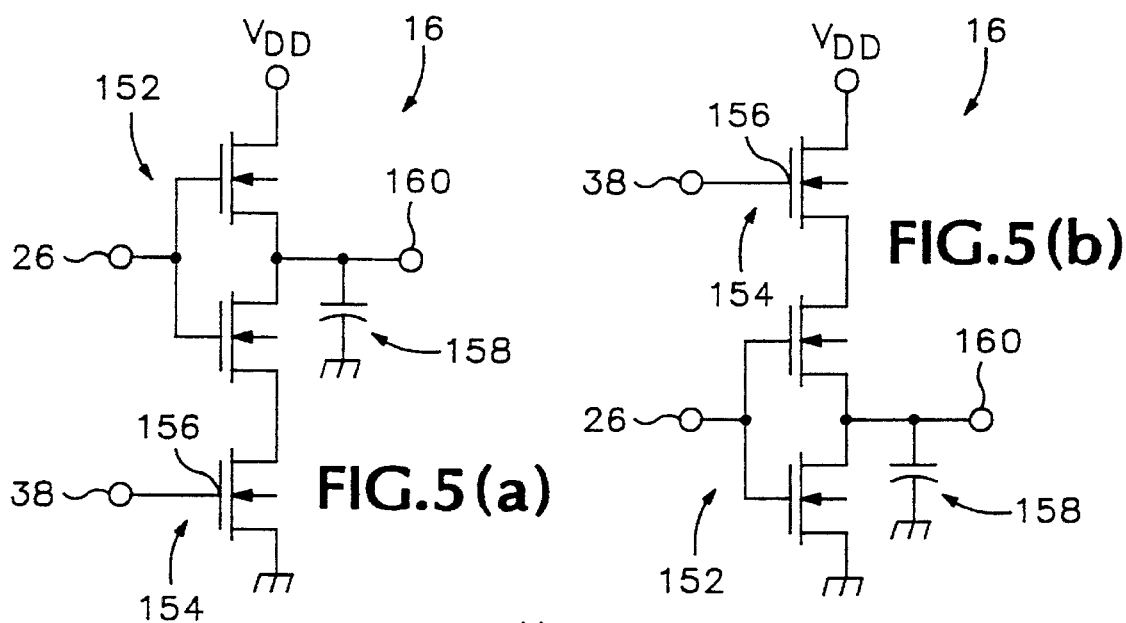
FIG. 5(a) is a schematic diagram of an exemplary parallel delay element of a type shown in FIG. 1, adapted to provide an adjustable delay for a falling edge of a reference clock.
FIG. 5(b) is a schematic diagram of an exemplary parallel delay element of a type shown in FIG. 1, adapted to provide an adjustable delay for a rising edge of a reference clock.

The delay adjustment element 154 may be seen to operate in FIG. 5(a) as a control of the discharge rate of a capacitor 158. Accordingly, a signal is available at output 160 having a normal rising edge and a falling edge which is adjustably delayed according to the error voltage at the adjustment input 38. Similarly, the delay adjustment element 154 may be seen to operate in FIG. 5(b) as a control of the charge rate of the capacitor 158. Accordingly, a signal is available at output 160 having a normal falling edge and a rising edge which is adjustably delayed according to the error voltage at adjustment input 38.

The delay elements 16 not utilized to cooperate with the control system 62 are preferably of the same construction with the adjustment inputs 38 tied off.

Figure 6:
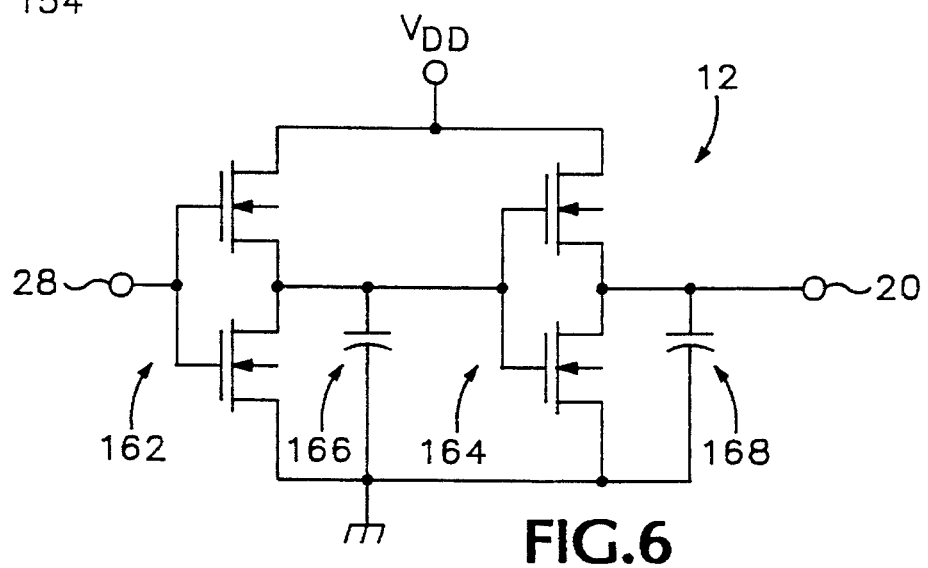
FIG. 6 is a schematic diagram of an exemplary fixed delay element of a type shown in FIG. 1.

FIG. 6 shows a fixed delay element 12 or 14. An input to a CMOS inverter 162 is connected at 28, and an output from a CMOS inverter 164 is available at 20, where the inverter 162 and 164 are connected in series to create a buffer. Capacitances 166 and 168 are parasitic.

In operation of the aforedescribed delay element, a reference clock signal is applied to the input 28 of the first buffer in a timing chain having 33 such buffers and propagates therethrough. The output 20 provides the reference clock signal with a phase delay. Storage and capture circuitry attached the outputs 20 are normally used to acquire an analog signal digitally by triggering from either a rising or a falling edge of the delayed clock signal. By this method, sample throughputs of up to 2 GS/s are available.

Because sample throughputs of greater than 2 GS/s are desired, outputs 20, in addition to serving as the inputs 28 to the next buffer in the chain, serve as the inputs to two additional branches of delay elements 14 and 16, as described above.

The delay of the adjustable parallel delay elements 16 is controlled with respect to the delay of the delay elements 14 preceding and following the first buffer of the timing chain, to fall half-way between them. Consequently, the adjustable parallel delay elements 16 in conjunction with the fixed parallel delay elements 14 provide twice as many strobe signals as would be available from the timing chain alone. Note as well that the principle of the invention may be applied to create, in the same manner as described above, other multiples of two times the number of strobe signals between selected fixed delay elements 12.

The same control signal is applied to the adjustment inputs 154 of all the adjustable parallel delay elements 16, which causes all the adjustable parallel delay elements 16 to have delays displaced from those of their associated fixed parallel delay elements 14 by the amount determined at the first buffer.

It is to be recognized that, while a specific circuit has been shown as the preferred embodiment of the invention, other circuit configurations could be utilized without departing from the principles of the invention.

The terms and expressions which have been employed in the foregoing specification are used therein as terms of description and not of limitation, and there is no intention of the use of such terms and expressions of excluding equivalents of the features shown and described or portions thereof, it being recognized that the scope of the invention is defined and limited only by the claims which follow.

We claim:

1. A system for sampling an analog signal, comprising:
   a first delay element having a clock input and a clock output;
   a second delay element having a clock input connected to said clock input of first delay element, a delay adjustment input and a clock output;
   a first sampling circuit, responsive to said output of said first delay element, for sampling said output of said second delay element to produce a first control signal representative of the delay between the output of said first delay element and the output of said second delay element; and
   a control circuit, responsive to said first control signal and connected to said adjustment input for adjusting the amount of delay provided by said second delay element.

2. The system of claim 1, wherein said sampling circuit includes a switching element having a signal input connected to said output of said second delay element, a gating input connected to said output of said first delay element, and an output connected to a storage element for producing said first control signal.

3. The system of claim 1, wherein said second delay element includes an adjustable delay element.

4. The system of claim 1, further comprising a third delay element having a clock input connected to said clock output of said first delay element and a clock output, said first sampling circuit being responsive to said output of said third delay element and thereby responsive to said output of said first delay element.

5. The system of claim 1, further comprising a third delay element having a clock input connected to said clock input of said first delay element and a clock output, and a second sampling circuit, responsive to said output of said second delay element, for sampling said output of said third delay element to produce a second control signal representative of the delay between said output of said third delay element and the output of said second delay element, said control circuit being responsive to said first control signal and said second control signal.

6. The system of claim 5, wherein said control circuit comprises a switched capacitor accumulator having an output for producing a third control signal representative of the difference in accumulated charge between said first control signal and said second control signal, said third control signal being applied to said adjustment input of said second delay element.

7. The system of claim 6, further comprising a fourth delay element having a clock input connected to said clock output of said first delay element and a clock output, said first sampling circuit being responsive to said output of said fourth delay element and thereby responsive to said output of said first delay element.

8. The system of claim 7, wherein each of said second and fourth delay elements comprise two inverting buffers in series having a junction output therebetween, the second of said two buffers providing said clock output, said first sampling circuit being responsive to the junction output of said fourth delay element and said second sampling circuit being responsive to the junction output of said second delay element.

9. The system of claim 8, wherein said clock output of said third delay element, said clock output of said second delay element, and said clock output of said fourth delay element provides first, second and third strobe signals, respectively, for sampling said analog signal.

10. The system of claim 9, wherein said first, second, third and fourth delay elements comprise one of a plurality of such delay elements, the first delay elements of said plurality of delay elements being in series and the fourth delay elements of said plurality of delay elements comprising the third delay elements of the subsequent respective pluralities of delay elements.

11. The system of claim 10, wherein said control circuit is responsive to one of said plurality of delay elements and produces a control signal that is applied to a plurality of said second delay elements.

12. A method for sampling an analog signal, comprising the steps of:

applying a clock signal to a first delay line;

receiving said clock signal at a first point on said first delay line and applying it to a second delay line;

receiving said clock signal at a second point on said first delay line;

sampling a clock signal produced by said second delay line using said clock signal received from said second point on said first delay line to produce a first control signal; and applying said first control signal to said second delay line to adjust the amount of delay produced thereby.

\* \* \* \* \*